(12) United States Patent  
Koch

(10) Patent No.: US 7,999,988 B2  
(45) Date of Patent: Aug. 16, 2011

(54) OPTICAL MODULATOR USING A DUAL OUTPUT LASER EMBEDDED IN A MACH ZEHNDER INTERFEROMETER

(75) Inventor: Brian R. Koch, San Bruno, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/649,882

(22) Filed: Dec. 30, 2009

(65) Prior Publication Data

US 2011/0157670 A1    Jun. 30, 2011

(51) Int. Cl.
 *G02B 26/00* (2006.01)
 *G02F 1/01* (2006.01)
(52) U.S. Cl. ........................................ 359/238; 359/279
(58) Field of Classification Search ............ 359/238.315, 359/215, 247, 251–252, 254, 108, 237–238, 359/278–279, 290–292, 298, 300–302; 385/1–3, 385/40, 129–132, 5, 8–9
See application file for complete search history.

(56) References Cited

U.S. PATENT DOCUMENTS

| 7,062,111 B2* | 6/2006 | Grubb et al. .................... 385/14 |
| 2009/0245795 A1* | 10/2009 | Joyner et al. .................... 398/79 |
| 2009/0279576 A1* | 11/2009 | Joyner et al. .................... 372/26 |

OTHER PUBLICATIONS

F. Horst, William M.J. Green, B.J. Offrein, Yurii Vlasov; Echelle grating WDM (de-)multiplexers in SOI technology, based on a design with two stigmatic points; Proc. SPIE, vol. 6996, 69960R (2008); doi:10.1117/12.781232.

* cited by examiner

*Primary Examiner* — Dawayne A Pinkney
(74) *Attorney, Agent, or Firm* — Kevin A. Reif

(57) ABSTRACT

A laser is placed inside the Mach-Zehnder interferometer and the output from opposite ends of the laser are fed directly into the opposite arms of the Mach-Zehnder interferometer. If the output from opposite sides of the laser are equal in amplitude and wavelength, then when the outputs are recombined at the output of the modulator the intensity is dependent on the relative phase of the light in the two arms of the Mach-Zehnder, just as in a normal Mach-Zehnder modulator. Thus by modulating the phase of one or both arms of the modulator, an intensity modulated source is created. This reduces the overall size of the device, and may ensure that all of the output power from the laser is utilized.

16 Claims, 3 Drawing Sheets

OPTICAL MODULATOR USING A DUAL OUTPUT LASER EMBEDDED IN A MACH ZEHNDER INTERFEROMETER

FIELD OF THE INVENTION

Embodiments of the present invention are directed to optical modulators and, more particularly, to using a dual output laser embedded in a Mach-Zehnder interferometer.

BACKGROUND INFORMATION

In a typical Mach-Zehnder modulator, input light from a laser is split at the input of the modulator into two waveguides, and one or both arms of the waveguide are phase modulated. When the light from the two arms is recombined, constructive interference occurs if the phase of light in the two branches are equal, and destructive interference occurs if the phase of light in the two branches is opposite. Thus by changing the relative phase of the light in the two arms using an electrical signal to alter the index of refraction of material in the waveguide, the recombined output is modulated.

FIG. 1 illustrates a typical Mach-Zender modulator (MZM) 100 as discussed above. The MZM 100 may comprise, for example, Lithium Niobate (LN). A laser 102 may produce and optical input signal 104 that enters MZM 100. The optical input signal 104 is equally split by Y-junction 106 into two waveguides 108 and 110. And the signals in each waveguide may be phase modulated. The optical signal is recombined at Y-junction 112 and output as output optical signal 114.

During phase modulation, electrodes acting on phase modulation portions 116 and 118 are used to affect the modulation of the optical signals in each waveguide 108 and 110. A voltage applied to phase modulator 116 induces a change in the index of refraction. In one state, such as when a voltage is not applied to phase modulator 118, the optical signals recombined at Y-junction 112 are in-phase and interfere constructively. In this case, optical output signal 114 may be "high" and may be recognized as a logical "1."

In a second state, such as when a voltage is applied to phase modulator 118, the index of refraction may change causing a phase shift between the two arms of MZM 100. When the optical signals recombine at Y-junction 112, destructive interference occurs leading to a "low" optical output signal 106 that may be interpreted as a logical "0."

In practice it is possible to modulate the phase of only one arm of the Mach-Zehnder or to modulate both arms but in opposite directions, called "push-pull" operation. The second technique is typically faster although it requires more contacts and more power.

In any event, it would be preferred to reduce the size of the MZM and to improve overall efficiency.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Described is a way of reducing the size and improving the efficiency of an integrated laser with external Mach Zehnder modulator, or arrays of integrated lasers with external modulators.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
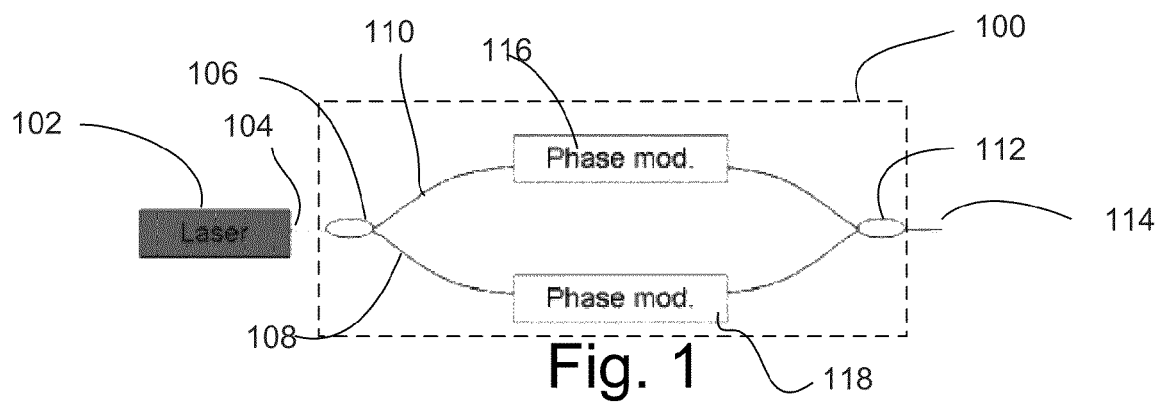
FIG. 1 is a block diagram showing a traditional laser/modulator structure.
Figure 2A:
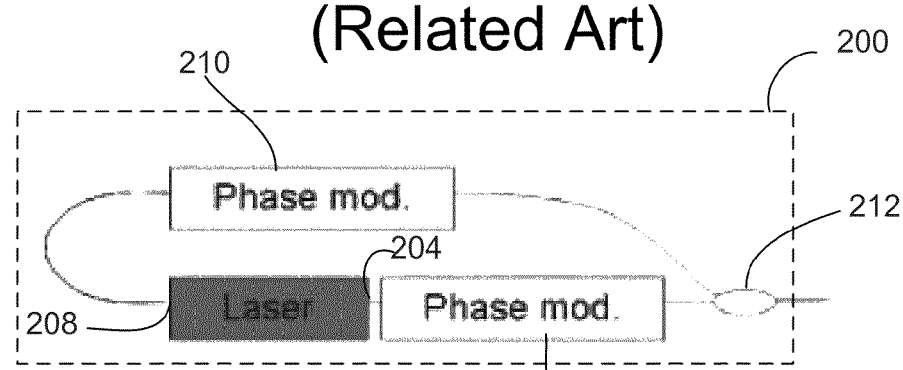
FIG. 2A is a block diagram showing a dual output laser embedded with a Mach Zehnder Interferometer according to one embodiment.
Figure 2B:
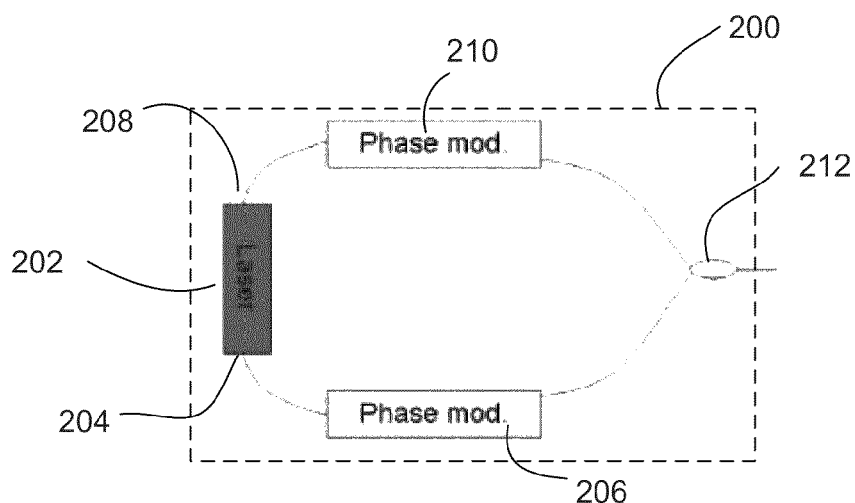
FIG. 2B is a block diagram of another embodiment of a dual output laser embedded with a Mach Zehnder Interferometer.

Referring now to FIGS. 2A and 2B, there is shown an integrated laser Mach-Zehnder modulator 200. This design takes advantage of that fact that certain lasers, such as symmetric distributed feedback (DFB) lasers output light from both ends, both the front facet and the rear facet. This allows for symmetric distributed feedback (DFB) lasers to be used, which are simpler to design than asymmetric DFBs. DFBs also tend to have lower threshold currents and can therefore be more efficient than other single wavelength lasers.

Thus, the laser 202 may placed inside the Mach-Zehnder modulator 200 and the output from opposite ends of the laser are fed directly into the opposite arms of the Mach-Zehnder modulator. As shown light from the front facet 204 is fed directly into the first phase modulator arm 206 of the MDM 200 and the light signal from the rear 208 of the laser 202 is fed into the second phase modulation arm 210 of the MZM 200. If both signals 204 and 208 are equal in amplitude and wavelength, then when the outputs are recombined at combiner 212 at the output of the modulator the intensity is dependent on the relative phase of the light in the two arms of the Mach-Zehnder, just as in a normal Mach-Zehnder modulator.

Thus by modulating the phase of one or both arms of the modulator, an intensity modulated source is created. Contrary to normal Mach-Zehnder structures, in this structure the light source is inside the Mach-Zehnder interferometer and the light is fed directly into the opposite arms. This reduces the loss associated with splitting the input light which is normally done in a MZI, and can likely reduce the space required for the overall structure. Additionally, since the output from both ends of the laser are used, this configuration inherently maximizes the efficiency.

Thus, the output from each end of the laser is fed directly into phase modulators and then into a symmetric echelle grating (or other wavelength combiner). If the grating is symmetric, then identical wavelengths input to opposite ends of the combiner will recombine at the output waveguide. Thus just as in the Mach Zehnder interferometer, the relative phase of the two ends will determine whether constructive or destructive interference occurs at the output. This process happens simultaneously for all of the other wavelengths as well. In this case, the need for the Mach-Zehnder's input and output couplers are eliminated which reduces the overall loss. Also, since the phase modulation sections can be placed anywhere along the path from the laser output to the entrance of the wavelength combiner, a significant amount of chip area may be conserved in this configuration.

FIG. 2B is similar structurally to the device shown in FIG. 2A and likewise labeled, but does not have the tight bends and hence may make for a slightly larger device.

Figure 3:
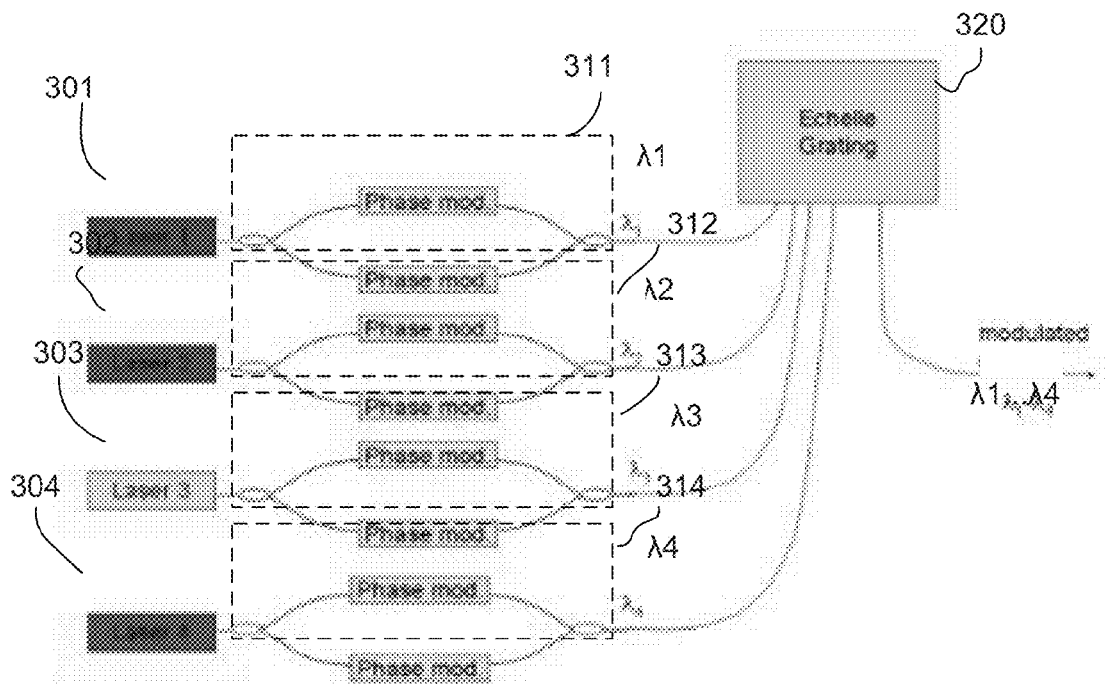
FIG. 3 a lock diagram of a traditional wavelength division multiplexer (WDM) transmitter.

In another embodiment additional advantages may arise when applying this technique to wavelength division multiplexed sources formed by arrays of lasers with Mach-Zehnder modulators. FIG. 3 illustrates a typical way of accomplishing this task. As shown there are a plurality of lasers, in this case four, 301, 302, 303, and 304, each outputting a wavelength of light λ1, λ2, λ3, and λ4, respectively. The output of each laser 301-304 is sent to its own Mach Zehnder modulator 311, 312, 313, and 314, and then the output from the modulators is sent into an echelle grating 320 (or any other type of wavelength combiner) where the modulated wavelengths are combined and output together.

Figure 4:
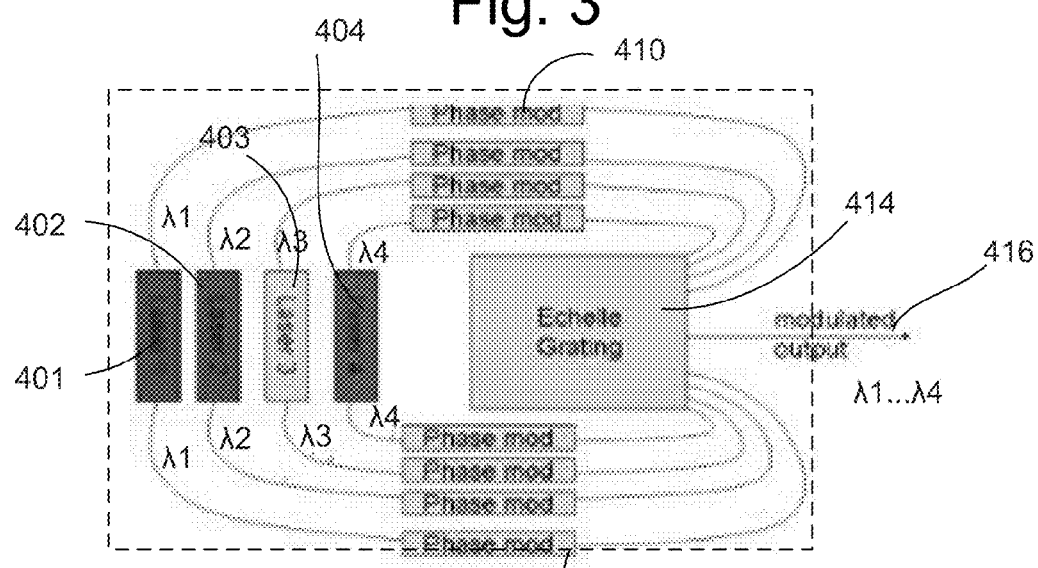
FIG. 4 is a block diagram of a WDM transmitter according to one embodiment of the invention.

Referring now to FIG. 4, in another embodiment, instead of using concepts from the technique described above, a functionally equivalent device is described expounding upon the inventive device shown in FIGS. 2A and 2B. Here, a plurality of lasers, four are shown, 401, 402, 403, and 404, each outputting a wavelength λ1, λ2, λ3, and λ4, respectively, from both their front and rear facets. The individual outputs for each wavelength are separately phase modulated with modulators 410 and 412. The individual outputs may be input into a combiner, such as an echelle grating 414 with outputs a modulated stream including λ1-λ4 in output 416.

Figure 5:
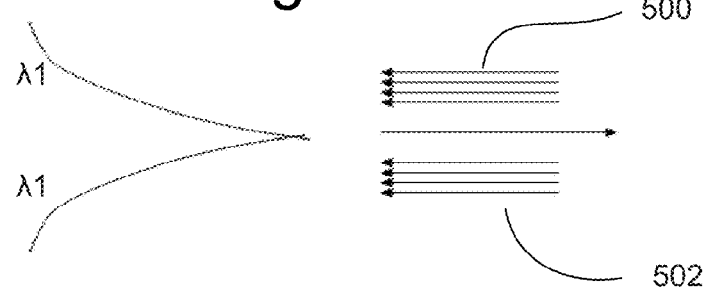
FIG. 5 is a block diagram of a proposed symmetric dual echelle grating according to one embodiment.

As shown in FIG. 5 the type of wavelength combiner 416 may involve that the light from the input waveguides from each side be focused to the same output waveguide, using two echelle gratings 500 and 502 (one for each side). To accomplish this, techniques such as those discussed in "Echelle grating WDM (de-)multiplexers in SOI technology, based on a design with two stigmatic points," F. Horst, W. M. J. Green, B. J. Offrien, Y. Vlasov, Silicon Photonics and Photonic Integrated Circuits, Proc. SPIE vol. 6996, 69960R, (2008), herein incorporated by reference, may be used. An example fabricated grating is shown in FIG. 5. This design has the input waveguide nearly parallel to the end of the echelle grating closest to the waveguides, as would probably be desirable for the WDM device disclosed here.

Figure 6:
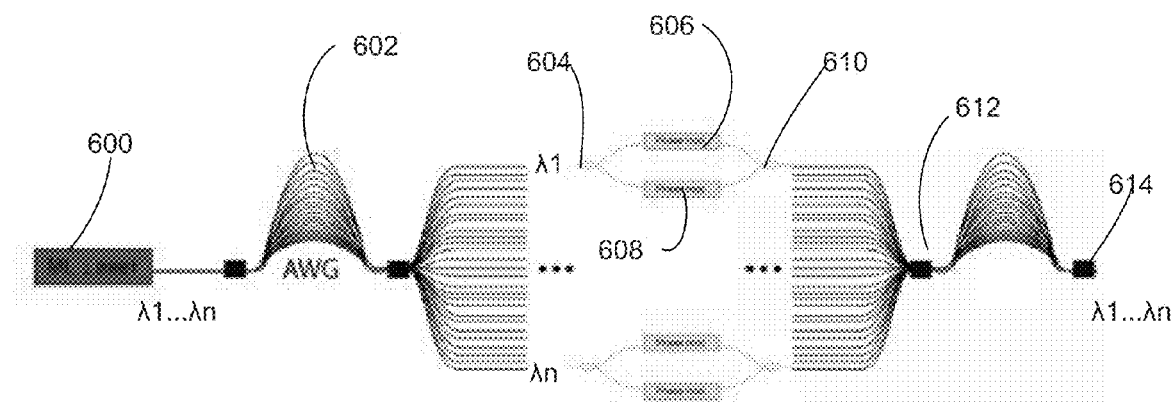
FIG. 6 is a block diagram of a traditional WDM transmitter with a multiple wavelength laser source.

FIG. 6 shows yet another example of a more traditional wave length division multiplexing WDM transmitter. Here, a mode locked laser 600 may output multiple wavelengths λ1-λn which may be separated into their individual wavelengths by a array waveguide grating 602. For each wavelength a Y-splitter 604 may divide each wavelength into two paths for modulation with modulators 606 and 608 whereupon they are recombined at junction 610. The individual modulated wavelengths may be multiplexed back into an output comprising modulated λ1-λn at the output 614.

Figure 7:
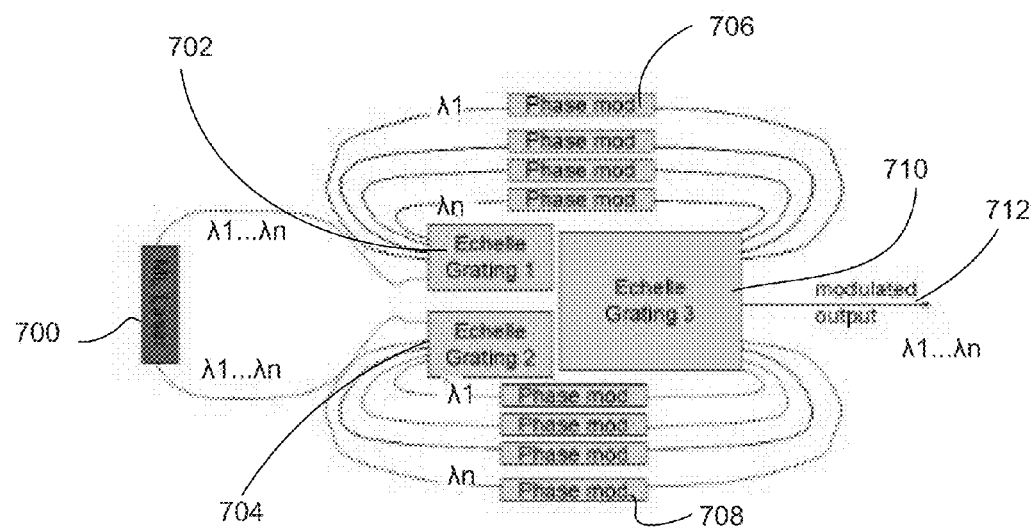
FIG. 7 is a block diagram of a WDM transmitter using a single multiple wavelength laser according to one embodiment of the invention.

FIG. 7 shows yet another embodiment of the invention for accomplishing a similar task as that device shown in FIG. 6 but with the laser embedded within the Mach Zehnder Interferometer. Here, a mode locked laser 700 may output a stream of light for both its front and back each comprising λ1-λn. A first echelle grating 702 may be used to separate the individual wavelengths from the front of the laser 700 and a second echelle grating 704 may be used to separate the individual wavelength from the back of the laser 700. In this case each wavelength from the front of the laser may be separately modulated with modulators 706 and the wavelengths from the rear of the laser may be modulated by modulators 708. The outputs from the modulators 706 and 708 may be combined by a third echelle grating 710 to produce a modulated output stream comprising λ1-λn at the output 712.

Thus, embodiments places the laser inside the Mach-Zehnder modulator reducing the overall size of the integrated source and ensuring that all of the output power from the laser is utilized (which is a particular issue for DFB lasers which are typically symmetric such that the output power is emitted evenly between both sides). Meanwhile it still provides all of the advantages of modulation capabilities of Mach-Zehnder modulators, whether the phase modulation sections are III-V based or silicon based.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
 a Mach-Zehnder interferometer having a first phase modulation arm and a second phase modulation arm;
 a laser embedded within the Mach-Zehnder interferometer, the laser to produce a front light beam and a rear light beam,
 wherein the front light beam is fed into the first phase modulation arm and the rear light beam is fed into the second modulation arm; and
 a combiner to combine outputs from the first phase modulation arm and the second phase modulation arm.

2. The apparatus as recited in claim 1 wherein the front light beam and the rear light beam are equal in amplitude and wavelength.

3. An apparatus as recited in claim 1 further comprising:
 a plurality of lasers embedded within the Mach-Zehnder interferometer, each laser to produce a front light beam and a rear light beam; and
 a plurality of first phase modulation arms and a plurality of second phase modulation arms, for each laser; and
 wherein the combiner is an echelle grating.

4. The apparatus as recited in claim 1 wherein the laser comprises a symmetric distributed feedback (DFB) laser.

5. A method, comprising:
   providing a Mach-Zehnder interferometer having a first phase modulation arm and a second phase modulation arm;
   embedding a laser within the Mach-Zehnder interferometer;
   feeding light from the front of the laser to the first phase modulation arm;
   feeding light from the rear of the laser to the second phase modulation arm; and
   combining outputs from the first phase modulation arm and the second phase modulation arm.

6. The method as recited in claim 5 further comprising:
   phase modulating the light within one or both of the first phase modulation arm and the second phase modulation arm.

7. The method as recited in claim 6 wherein the light from the front of the laser and light from the rear of the laser are equal in amplitude and wavelength.

8. An apparatus, comprising:
   a plurality of lasers each to output a front beam and a rear beam; a plurality of Mach-Zender interferometers, each of the Mach-Zender interferometers comprising:
   a front beam phase modulation arm to modulate the front beam of one of the lasers;
   a rear beam phase modulation arm to modulate the rear beam of a same laser; and
   a combiner to combine the outputs front beam phase modulation arms and the rear beam phase modulation arms.

9. The apparatus as recited in claim 8 wherein the combiner comprises an echelle grating.

10. The apparatus as recited in claim 9 wherein the echelle grating comprises two echelle gratings side-by-side.

11. The apparatus as recited in claim 8 wherein each front beam and rear beam for each laser are equal in amplitude and wavelength.

12. The apparatus as recited in claim 8 wherein the lasers, the front beam phase modulation arms, the rear beam phase modulation arms, and the coupler are embedded in the same device.

13. The apparatus as recited in claim 8 wherein each of the plurality of lasers comprise symmetric distributed feedback (DFB) lasers.

14. An apparatus, comprising:
   a laser to output multiple wavelengths of light from both a front and rear of the laser;
   a first echelle grating to separate light from the front of the laser into individual wavelengths;
   a second echelle grating to separate light from the rear of the laser into individual wavelengths;
   a first set of phase modulation arms to modulate wavelengths output from the first echelle grating;
   a second set of phase modulation arms to modulate wavelengths output from the second echelle grating; and
   a third echelle grating to combine outputs from the first set of phase modulation arms and the second set of phase modulation arm.

15. The apparatus as recited in claim 14 wherein the laser is a mode locked laser.

16. The apparatus are recited in claim 14 wherein the light from both the front and rear of the laser are equal in amplitude and wavelength.

* * * * *